United States Patent
Murano

(10) Patent No.: US 7,026,661 B2
(45) Date of Patent: Apr. 11, 2006

(54) LIGHT EMITTING DEVICE AND MANUFACTURING METHOD THEREOF

(75) Inventor: Yoshio Murano, Yamanashi-ken (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 83 days.

(21) Appl. No.: 10/677,229

(22) Filed: Oct. 3, 2003

(65) Prior Publication Data

US 2004/0069993 A1  Apr. 15, 2004

Related U.S. Application Data

(62) Division of application No. 10/164,557, filed on Jun. 10, 2002, now Pat. No. 6,707,247.

(30) Foreign Application Priority Data

Jun. 11, 2001 (JP) .............................. 2001-176355

(51) Int. Cl.
*H01L 33/00* (2006.01)

(52) U.S. Cl. .................... 257/100; 438/22; 313/512

(58) Field of Classification Search ................ 257/79, 257/98, 81, 86, 99, 100, 103, 95, 94, 101, 257/433, 434, 436; 313/512; 438/26, 29, 438/32

See application file for complete search history.

(56) References Cited

U.S. PATENT DOCUMENTS 6,649,946 B1 * 11/2003 Bogner et al. .............. 257/233
2001/0000622 A1 * 5/2001 Reeh et al. .................... 257/98

FOREIGN PATENT DOCUMENTS

JP  2000156528  6/2000
JP  2002164934  6/2002

* cited by examiner

*Primary Examiner*—Hoai Pham
*Assistant Examiner*—Dana Farahani
(74) *Attorney, Agent, or Firm*—Dennison, Schultz, Dougherty & MacDonald

(57) ABSTRACT

A light emitting device has a substrate, an LED mounted on the substrate. A first transparent layer seals the LED, and a second transparent layer is provided around the first transparent layer. Particles of fluorescent material are included in the second transparent layer. A reflector layer is formed on outside walls except an upper side.

2 Claims, 6 Drawing Sheets

LIGHT EMITTING DEVICE AND MANUFACTURING METHOD THEREOF

This application is a division of Ser. No. 10/164,557 filed Jun. 10, 2002, now U.S. Pat No. 6,707,247.

BACKGROUND OF THE INVENTION

The present invention relates to a light emitting device using the light emitting diode (LED) and the method for manufacturing the device.

The LED is made by forming a pn junction on a semiconductor wafer consisting of a compound of the III-V family such as GaP, GaAs and the like.

Experiments have been carried out to obtain a light emitting device which emits desired colors. The light emitting device has a sealing resin such as epoxy resin and silicon resin. In order to generate a desired color, fluorescence materials are mixed in sealing resin.

However, since the fluorescence material is heavy compared with the sealing resin, particles of the fluorescence material deposit in the resin before hardening of the resin. The deposited particles disperse irregularly on the LED and the substrate. Consequently, the light emitted by the light emitting device is irregular in color and luminance distribution.

On the other hand, there has been provided a method for manufacturing a plurality of light emitting devices by using dyes. However, the dye method is complicated because of a number of process steps.

SUMMARY OF THE INVENTION

An object of the present invention is to provide a light emitting device having uniform color and luminance distribution.

Another object of the present invention is to provide a method which is able to manufacture a light emitting device at few steps.

According to the present invention, there is provided a light emitting device comprising a substrate, an LED mounted on the substrate, a first transparent layer sealing the LED, a second transparent layer provided around the first transparent layer, fluorescent material being included in either of the first transparent layer and the second transparent layer, and a reflector layer formed on outside walls except an upper side.

A coloring agent is included in either of the first and second transparent layers.

Fluorescent material and a coloring agent are included in either of the first and second transparent layers.

The second transparent layer has an inverted trapezoid shape in section.

A method for manufacturing a light emitting device, comprising the steps of preparing a substrate aggregation having a plurality of substrate divisions, mounting an LED on the substrate division, forming a first transparent layer on the substrate aggregation, cutting off the first transparent layer at division lines surrounding the substrate division to form an individual first transparent layer, forming a second transparent layer on the individual first transparent layer, cutting off the second transparent layer at division lines surrounding the substrate division to form an individual second transparent layer, forming a reflector film on outside walls of the individual second transparent layer, and dividing the substrate division at division lines of the division.

The method further comprises providing a substrate attachment between adjacent substrate divisions, and cutting off the substrate attachment and the second transparent layer in an inverted V-shape in section.

These and other objects and features of the present invention will become more apparent from the following detailed description with reference to the accompanying drawings.

DETAILED DESCRIPTION OF THE PREFERRED EMBODIMENT

Figure 1:
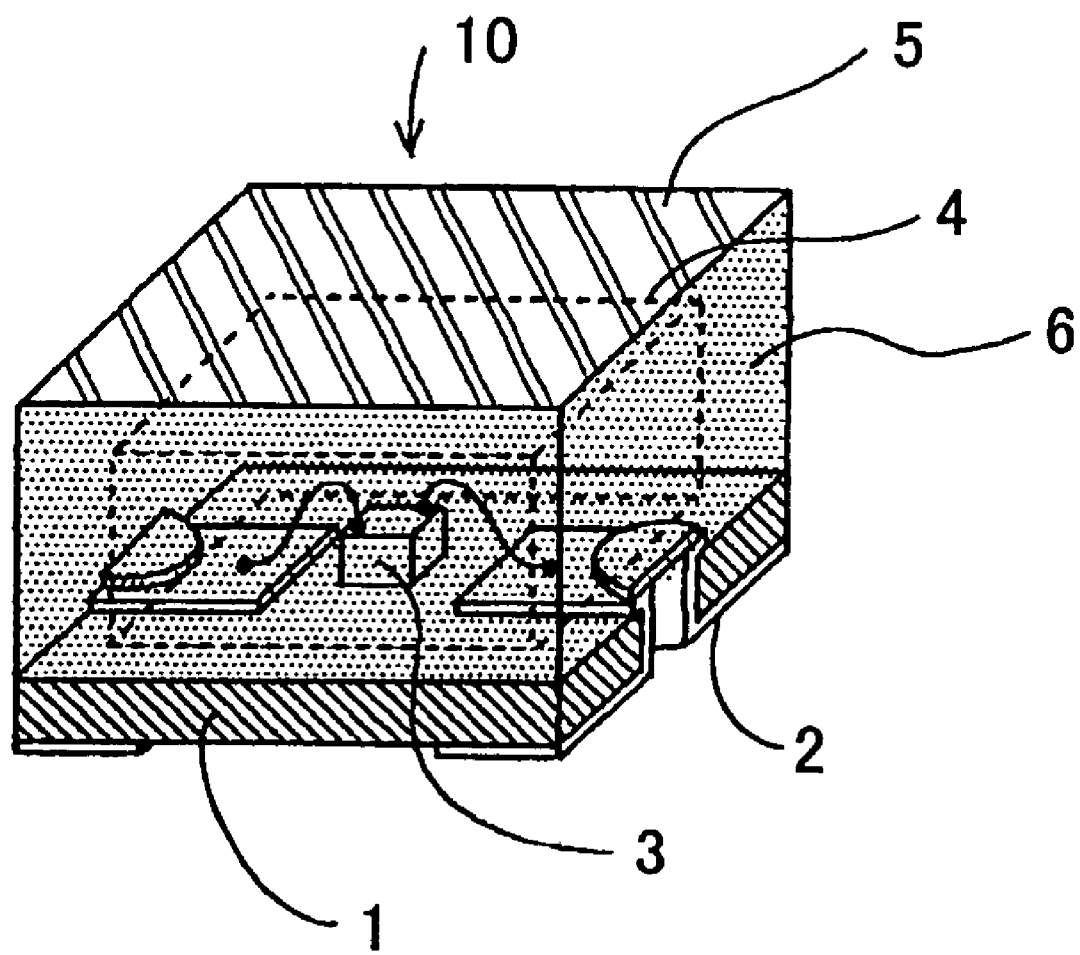
FIG. 1 is a perspective view of a light emitting device according to a first embodiment of the present invention.

Referring to FIG. 1 showing a perspective view of a light emitting device according to a first embodiment of the present invention, the light emitting device 10 comprises a substrate 1 made of an insulation material such as an epoxy resin, a pair of opposite electrodes 2, each of which extends to the underside of the substrate as a terminal, an LED 3 mounted on the substrate and connected to the electrodes 2 by wire bonding.

The LED 3 is composed to emit blue light. The LED 3 is sealed by a first sealing cubic transparent layer 4 made of a transparent resin such as epoxy resin. The first transparent layer 4, in turn is covered by a second parallelpiped transparent layer 5 made of transparent resin such as epoxy resin. In the second transparent layer 5, particles of fluorescence material such as yttrium aluminum garnet (YAG), and particles of coloring agent are included. Outside walls of the second transparent layer 5 except the upper side are covered by a reflector layer 6 by metal plating of silver or aluminum.

The blue light emitted from the LED 3 enters in the second transparent layer 5 passing through the first transparent layer 4. When the blue light catches the particle of fluorescence material, the blue changes into yellow. When the blue light which does not catch the particle of fluorescence material mixes with the yellow light, the lights changes into white. The white changes into a desired color dependent on the color of the coloring agent. If the desired color is pink, coloring agent of red is mixed in the second layer 5. Thus, pink light emits from the light emitting device 10. The coloring agent may be mixed in the first transparent layer.

A method for manufacturing the light emitting device 10 will be described hereinafter.

Figure 2A:
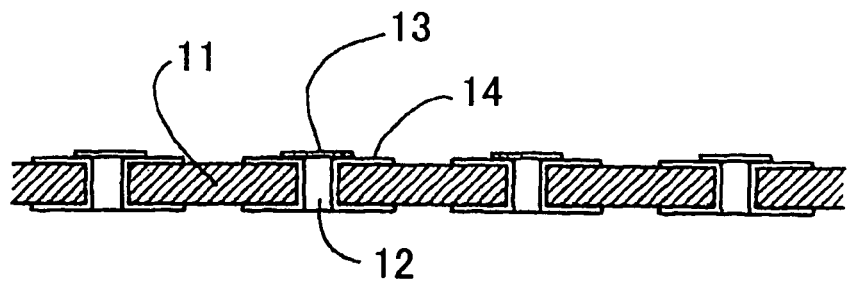
FIGS. 2a to 2j show a method for manufacturing light emitting devices.

Referring to FIG. 2a, a substrate aggregation 11 comprising a plurality of substrate divisions which are to be divided into individual substrate 1 at the last step is drilled to form through-holes 12 at every border between adjacent divisions. Films of copper foil on the upper side and under side of each substrate division of the substrate aggregation 11 are electrically connected by a conductive layer 14 formed by electroless copper deposition. A dry film 13 is adhered to the upper surface of the conductive layer 14 to close the opening of the through-hole 12. Furthermore, electrodes are formed on the conductive layer 14 by electrolytic deposition of Ni and Au.

Figure 2B:
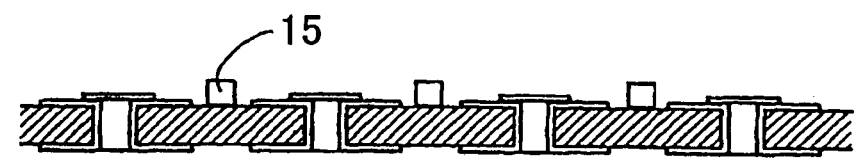
Figure 2C:
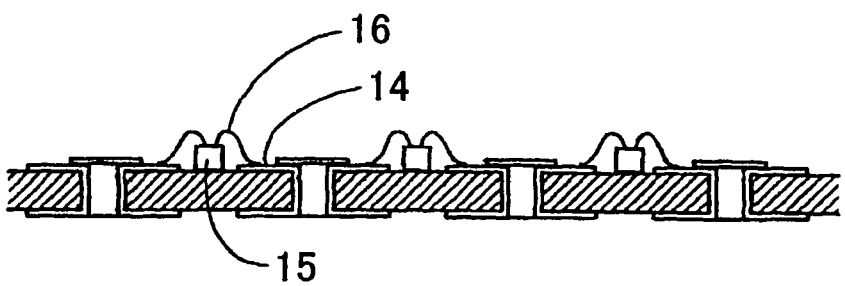
Figure 2D:
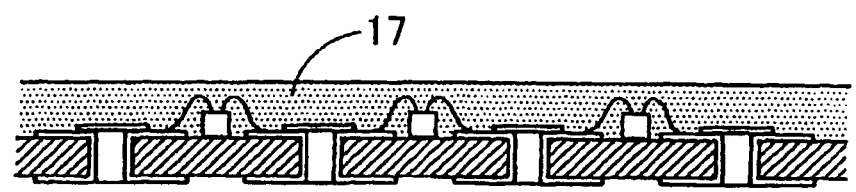
Figure 2E:
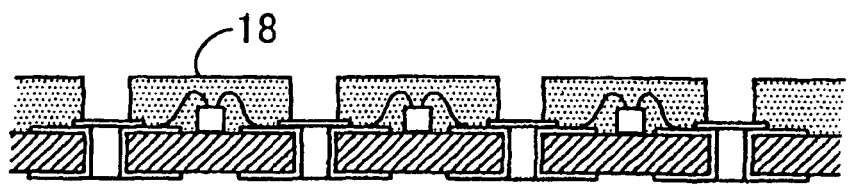

Referring to FIG. 2b, an LED 15 is mounted on the substrate aggregation 11 at each substrate division by die bonding. The mounted LED 15 is connected to the electrodes by wire bonding of Au or Al wires 16, as shown in FIG. 2c. The upper surface of the substrate aggregation 11 is sealed by a first resin layer 17 of epoxy resin as shown in FIG. 2d. The first resin layer 17 is divided into an individual first resin layer 18 at every division by half dicing as shown in FIG. 2e.

Figure 2F:
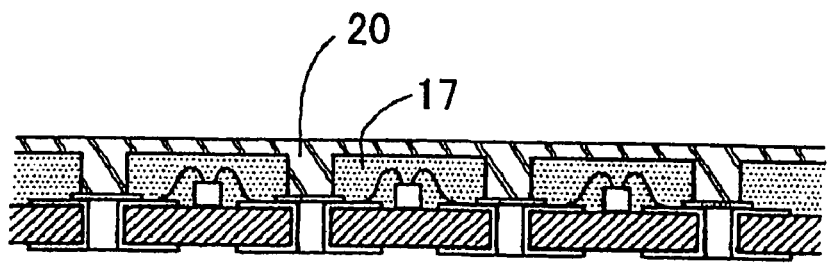
Figure 2G:
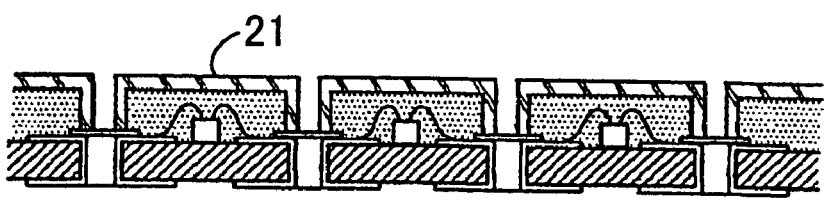
Figure 2H:
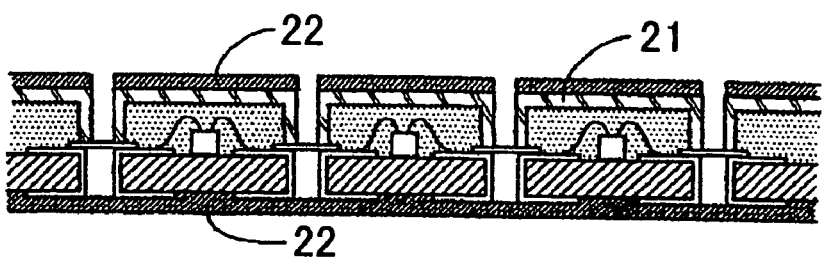
Figure 2I:
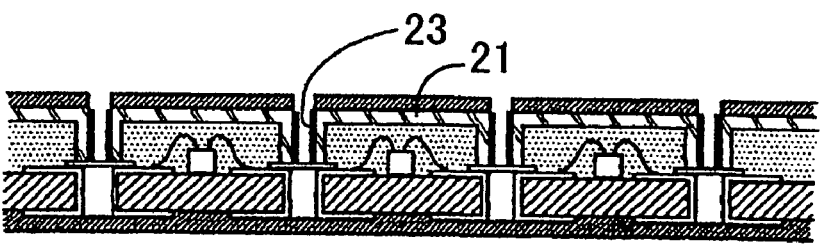
Figure 2J:
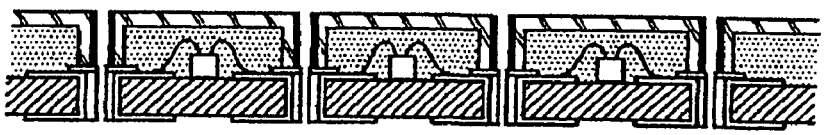

Referring to FIG. 2f, the first resin layer 18 is coated with a second resin layer 20 of silicon resin including a fluorescent agent and a coloring agent. The second resin layer 20 is divided into an individual second resin layer 21 at every division by half dicing as shown in FIG. 2g. Plating resists 22 are printed on the second resin layers 21 and the underside of the substrate aggregation as shown in FIG. 2h. Referring to FIG. 2i, a reflect film 23 is formed on outside of the second resin layer 21 by plating at each division. As shown in FIG. 2j, the plating resists 22 are removed, and each division is separated by full dicing. Thus, the light emitting device 10 of FIG. 1 is completed.

Figure 3:
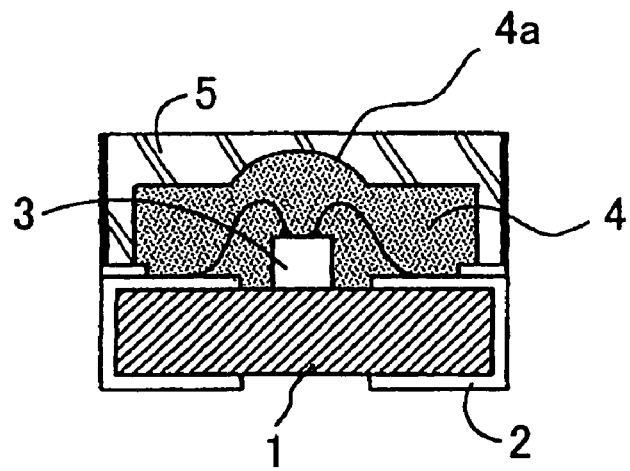
FIG. 3 is a sectional view of a light emitting device according to a second embodiment of the present invention.

Referring to FIG. 3 showing a sectional view of a light emitting device according to a second embodiment of the present invention, the same parts as FIG. 1 are identified with the same reference numeral as FIG. 1, and the explanation of the parts is omitted.

A condenser lens portion 4a is formed on the surface of the first transparent layer 4. The condenser lens portion 4a condenses the light from the LED 3, thereby increasing the luminance of the emitted light.

Figure 4:
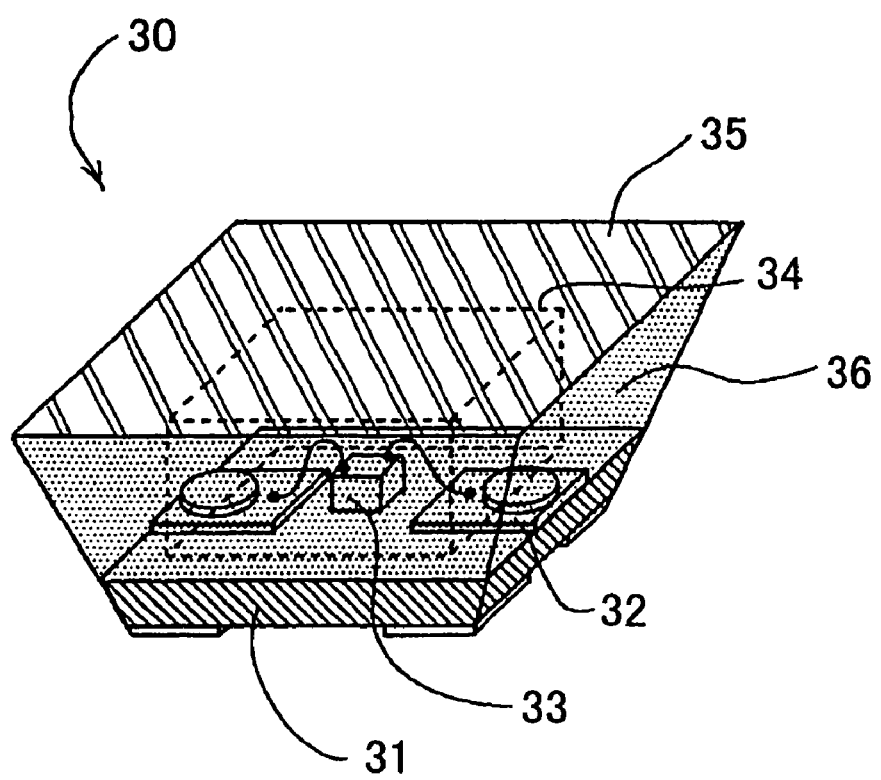
FIG. 4 is a perspective view showing a third embodiment.

A third embodiment of the light emitting device of the present invention will be described with reference to FIG. 4.

The light emitting device 30 comprises a substrate 31 made of epoxy resin, a pair of electrodes 32 formed on both sides of the substrate 31, an LED 33 mounted on the substrate, and a first transparent layer 34. These members are the same as those of the first embodiment of FIG. 1.

The substrate 31 and the first transparent layer 34 are covered by a second transparent layer 35 made of silicon resin and having an inverted trapezoid in section. A fluorescent material and coloring agent are included in the second layer 35. A reflector film 36 are formed on the outside walls of the second transparent layer 35. Thus, the light emitting device 30 has a light expansion effect.

A method for manufacturing the light emitting device 30 is explained hereinafter with reference to FIGS. 5a through 5j.

Figure 5A:
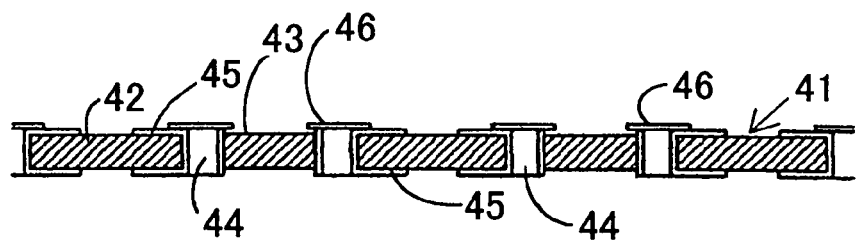
FIGS. 5a to 5j show another method for manufacturing light emitting devices.

Referring to FIG. 5a, a substrate aggregation 41 comprises a plurality of substrate divisions 42 which are to be divided into individual substrate 31 at the last step and a substrate attachment 43 provided between adjacent substrate divisions 42. The substrate aggregation 41 is drilled to form through-holes 44 at both sides of the substrate division 42. Films of copper foil on both sides of division of substrate aggregation 41 are electrically connected by a conductive layer 45 formed by electroless copper deposition. A dry film 46 is adhered to the upper surface of the conductive layer 45 to close the opening of the through-hole 44. Furthermore, electrodes are formed on the conductive layer 45 by electrolytic deposition of Ni and Au.

Figure 5B:
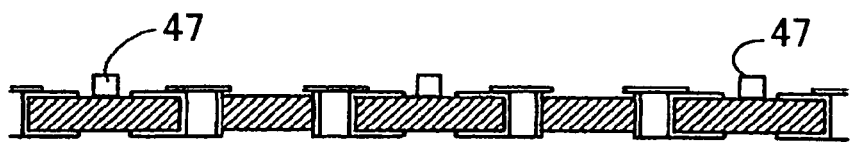
Figure 5C:
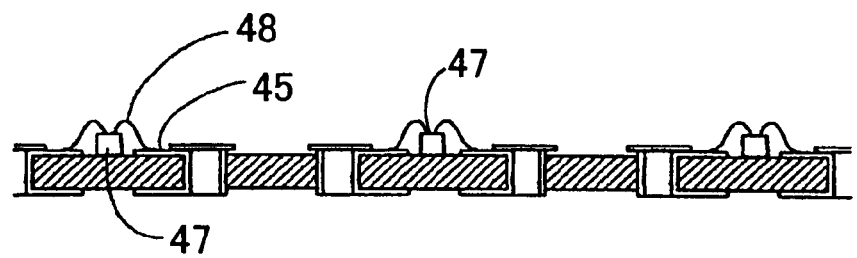
Figure 5D:
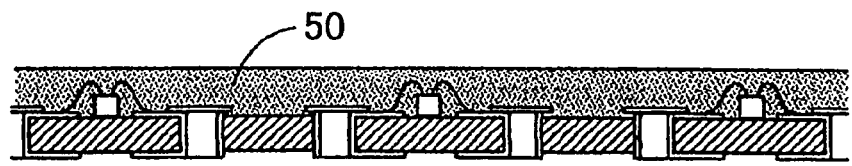
Figure 5E:
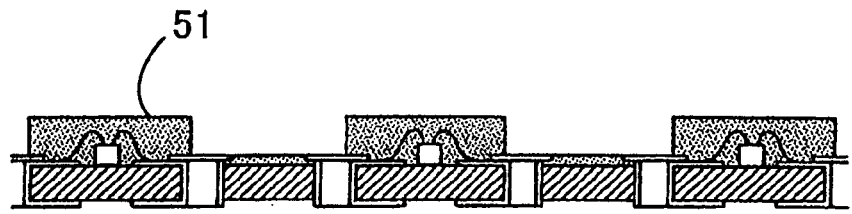

Referring to FIG. 5b, an LED 47 is mounted on the substrate aggregation 41 at each substrate division 42 by diebonding. The mounted LED 47 is connected to the electrodes on the conductive layer 45 by wire bonding of Au or Al wires 48, as shown in FIG. 5c. The upper surface of the substrate aggregation 41 is sealed by a first resin layer 50 of epoxy resin as shown in FIG. 5d. The first resin layer 50 is divided into an individual first resin layer 51 at every division by half dicing as shown in FIG. 5e.

Figure 5F:
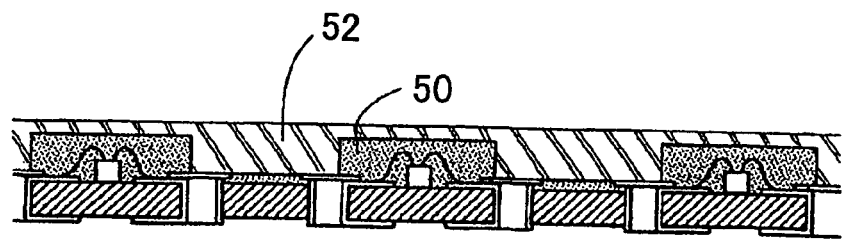
Figure 5G:
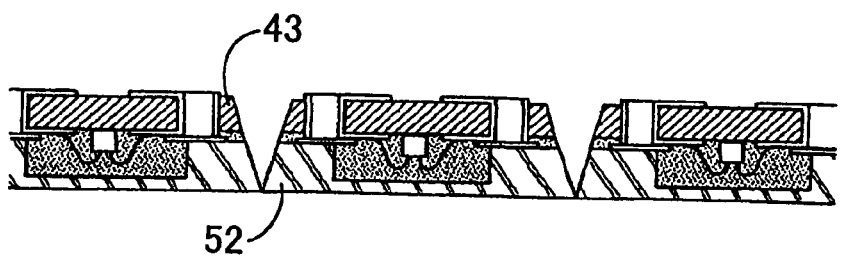
Figure 5H:
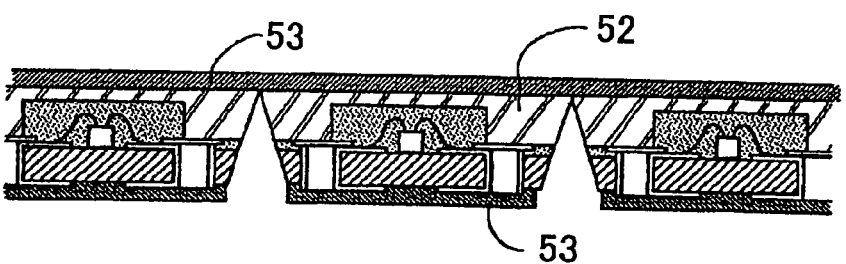
Figure 5I:
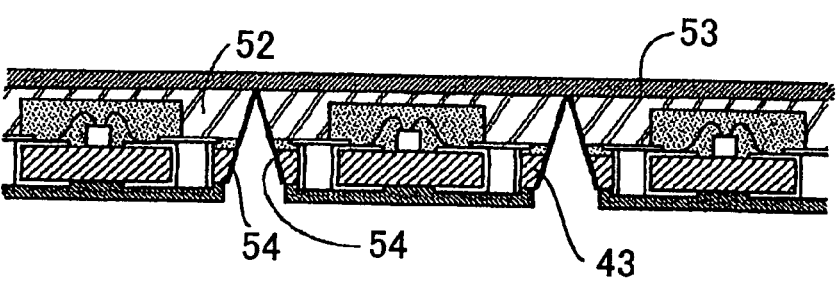
Figure 5J:
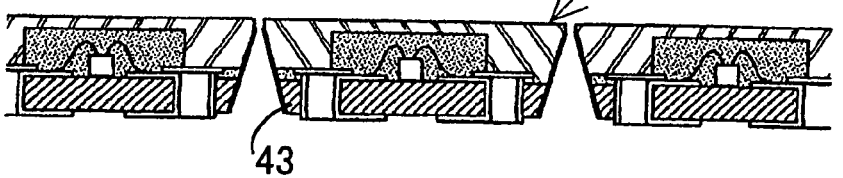

Referring to FIG. 5f, the first resin layer 50 is coated with a second resin layer 52 of silicon resin including a fluorescent material and a coloring agent. Then, the assembly is inverted as shown in FIG. 5g. The substrate attachment 43 and the second resin layer 52 are cut off by a cutter having a V-shape. The other sides (not shown) of the substrate division 42 is similarly cut off. The assembly is inverted again as shown in FIG. 5h. A plating resists 53 are printed on the second resin layers 52 and the underside of the substrate aggregation as shown in FIG. 5h. Referring to FIG. 5i, a reflector film 54 is formed on outside of the second resin layer 52 and the substrate attachment 43 by plating. As shown in FIG. 5j, the plating resists 53 are removed, and each division is separated by full dicing. Thus, the light emitting device 30 of FIG. 4 is completed.

In the light emitting device of the present invention, the second transparent layer is formed on the first transparent layer. Therefore, particles of the fluorescent material are uniformly diffused on the surface of the first transparent layer without depositing on the LED. Consequently, light uniformly emits from the light emitting device.

In the method of the present invention, dies are not used. Therefore, a plurality of light emitting devices can be manufactured at simple steps.

While the invention has been described in conjunction with preferred specific embodiment thereof, it will be understood that this description is intended to illustrate and not limit the scope of the invention, which is defined by the following claims.

What is claimed is:

1. A light emitting device comprising:
   a substrate having a flat upper surface;
   an LED mounted on the upper surface of the substrate;
   a first transparent layer mounted on the substrate for sealing the LED;
   a second transparent layer having an underside surface coextensive with the upper surface of the substrate and mounted on the upper surface of the substrate so as to surround the first transparent layer;
   fluorescent material being included in the second transparent layer;
   particles of coloring agent included in the second transparent layer; and
   a reflector layer formed on peripheral outside walls of the second transparent layer except an upper side thereof.

2. The light emitting device according to claim 1 wherein the second transparent layer has an inverted trapezoid shape in section.

* * * * *